United States Patent … US 7,772,060 B2
Jumpertz et al.  (45) Date of Patent: Aug. 10, 2010

(54) INTEGRATED SIGE NMOS AND PMOS TRANSISTORS

(75) Inventors: Reiner Jumpertz, Freising (DE); Klaus Schimpf, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/761,164

(22) Filed: Jun. 11, 2007

(65) Prior Publication Data

US 2007/0298561 A1    Dec. 27, 2007

Related U.S. Application Data

(60) Provisional application No. 60/882,367, filed on Dec. 28, 2006.

(30) Foreign Application Priority Data

Jun. 21, 2006  (DE) .................. 10 2006 028 543

(51) Int. Cl.
*H01L 21/8238* (2006.01)

(52) U.S. Cl. ............... 438/202; 257/205; 257/E21.695; 257/E21.696; 257/E27.109; 257/E27.015; 257/350; 257/511; 257/84; 257/273; 257/370; 257/378; 257/578; 438/207; 438/357; 438/360; 438/363

(58) Field of Classification Search .............. 438/202, 438/207, 357, 360, 363; 257/205, 350, 511, 257/84, 273, 370, 378, 578, E21.608, E21.695, 257/E21.696, E27.015, E27.109
See application file for complete search history.

(56) References Cited

U.S. PATENT DOCUMENTS 3,242,018 A * 3/1966 Grabmaier et al. .......... 257/565
5,006,912 A * 4/1991 Smith et al. ................ 257/200
5,155,571 A * 10/1992 Wang et al. ................. 257/19
5,216,271 A * 6/1993 Takagi et al. ............... 257/370
5,285,088 A * 2/1994 Sato et al. .................. 257/192
5,356,821 A * 10/1994 Naruse et al. .............. 438/234
5,365,090 A * 11/1994 Taka et al. ................. 257/197
5,422,502 A * 6/1995 Kovacic ..................... 257/197
5,440,152 A * 8/1995 Yamazaki ................... 257/197

(Continued)

FOREIGN PATENT DOCUMENTS

EP    0 587 520 A1    3/1994

(Continued)

*Primary Examiner*—Fernando L Toledo
*Assistant Examiner*—Ankush k Singal
(74) *Attorney, Agent, or Firm*—Warren L. Franz; Wade J. Brady, III; Frederick J. Telecky, Jr.

(57) ABSTRACT

A method of fabricating an integrated BiCMOS circuit is provided, the circuit including bipolar transistors 10 and CMOS transistors 12 on a substrate. The method comprises the step of forming an epitaxial layer 28 to form a channel region of a MOS transistor and a base region of a bipolar transistor. Growing of the epitaxial layer includes growing a first sublayer of silicon 28a, a first sublayer of silicon-germanium 28b onto the first sublayer of silicon, a second sublayer of silicon 28c onto the first sublayer of silicon-germanium, and a second sublayer of silicon-germanium 28d onto the second sublayer of silicon. Furthermore, an integrated BiCMOS circuit is provided, which includes an epitaxial layer 28 as described above.

8 Claims, 3 Drawing Sheets

U.S. PATENT DOCUMENTS

| | | | | |
|---|---|---|---|---|
| 5,465,006 A * | 11/1995 | Chen | ........................... | 257/557 |
| 5,476,813 A * | 12/1995 | Naruse | ....................... | 438/311 |
| 5,541,124 A * | 7/1996 | Miwa et al. | ................. | 438/366 |
| 5,583,059 A * | 12/1996 | Burghartz | ................... | 438/319 |
| 5,665,615 A * | 9/1997 | Anmo | ........................ | 438/202 |
| 5,696,007 A * | 12/1997 | Ryum et al. | ................. | 438/320 |
| 5,714,777 A * | 2/1998 | Ismail et al. | ................ | 257/263 |
| 5,834,800 A * | 11/1998 | Jalali-Farahani et al. | .... | 257/198 |
| 5,840,603 A * | 11/1998 | Sakamoto | ................... | 438/202 |
| 5,962,879 A * | 10/1999 | Ryum et al. | ................. | 257/198 |
| 5,963,817 A * | 10/1999 | Chu et al. | ................... | 438/410 |
| 6,028,345 A * | 2/2000 | Johnson | ....................... | 257/592 |
| 6,111,267 A * | 8/2000 | Fischer et al. | ................. | 257/19 |
| 6,171,894 B1 * | 1/2001 | Laurens | ....................... | 438/202 |
| 6,248,650 B1 * | 6/2001 | Johnson | ....................... | 438/552 |
| 6,251,751 B1 * | 6/2001 | Chu et al. | ................... | 438/439 |
| 6,278,143 B1 * | 8/2001 | Ejiri | ............................ | 257/273 |
| 6,326,253 B1 * | 12/2001 | Kotani | ........................ | 438/202 |
| 6,399,970 B2 * | 6/2002 | Kubo et al. | ................. | 257/194 |
| 6,440,810 B1 * | 8/2002 | Johansson et al. | ........... | 438/309 |
| 6,441,446 B1 * | 8/2002 | Patti | ............................ | 257/378 |
| 6,465,870 B2 * | 10/2002 | Voldman | .................... | 257/565 |
| 6,515,335 B1 * | 2/2003 | Christiansen et al. | ....... | 257/347 |
| 6,541,356 B2 * | 4/2003 | Fogel et al. | ................. | 438/480 |
| 6,570,242 B1 * | 5/2003 | Johnson | ....................... | 257/593 |
| 6,586,298 B1 * | 7/2003 | Naem | .......................... | 438/235 |
| 6,586,818 B1 * | 7/2003 | Voldman | .................... | 257/587 |
| 6,593,640 B1 * | 7/2003 | Kalnitsky et al. | ........... | 257/565 |
| 6,597,016 B1 * | 7/2003 | Yuki et al. | .................... | 257/77 |
| 6,646,322 B2 * | 11/2003 | Fitzgerald | ................... | 257/531 |
| 6,649,482 B1 * | 11/2003 | Naem | .......................... | 438/361 |
| 6,750,486 B2 * | 6/2004 | Sugawara et al. | ........... | 257/265 |
| 6,800,921 B1 * | 10/2004 | Coolbaugh et al. | .......... | 257/532 |
| 6,806,524 B2 * | 10/2004 | Ooishi | ........................ | 257/295 |
| 6,900,094 B2 * | 5/2005 | Hammond et al. | .......... | 438/238 |
| 6,995,078 B2 * | 2/2006 | Liu et al. | ..................... | 438/483 |
| 7,005,359 B2 * | 2/2006 | Ahmed et al. | ............... | 438/366 |
| 7,064,037 B2 * | 6/2006 | Liu | .............................. | 438/285 |
| 7,195,987 B2 * | 3/2007 | Bae et al. | ..................... | 438/406 |
| 7,205,586 B2 * | 4/2007 | Takagi et al. | ................. | 257/192 |
| 7,300,846 B2 * | 11/2007 | Jung | ........................... | 438/285 |
| 7,482,258 B2 * | 1/2009 | Gebreselasie et al. | ........ | 438/612 |
| 2002/0061627 A1 * | 5/2002 | Kovacic | ....................... | 438/309 |
| 2002/0076893 A1 * | 6/2002 | Howard et al. | .............. | 438/374 |
| 2002/0125497 A1 * | 9/2002 | Fitzgerald | ................... | 257/191 |
| 2002/0132438 A1 * | 9/2002 | Dunn et al. | .................. | 438/343 |
| 2002/0158311 A1 * | 10/2002 | Ohnishi et al. | .............. | 257/591 |
| 2002/0158313 A1 * | 10/2002 | Takagi et al. | ................. | 257/593 |
| 2002/0160562 A1 * | 10/2002 | Babcock et al. | ............. | 438/207 |
| 2003/0082882 A1 * | 5/2003 | Babcock et al. | ............. | 438/309 |
| 2003/0132453 A1 * | 7/2003 | Greenberg et al. | .......... | 257/197 |
| 2004/0007715 A1 * | 1/2004 | Webb et al. | ................... | 257/192 |
| 2004/0235264 A1 * | 11/2004 | Forbes | ........................ | 438/429 |
| 2005/0064677 A1 * | 3/2005 | Davis | ........................ | 438/414 |
| 2005/0087805 A1 * | 4/2005 | Ning | ........................... | 257/350 |
| 2005/0127392 A1 * | 6/2005 | Chu et al. | .................... | 257/103 |
| 2005/0136584 A1 * | 6/2005 | Boyanov et al. | ............. | 438/199 |
| 2005/0145951 A1 * | 7/2005 | Kirchgessner | .............. | 257/370 |
| 2005/0145953 A1 * | 7/2005 | Chan et al. | ................... | 257/378 |
| 2005/0181549 A1 * | 8/2005 | Barr et al. | ..................... | 438/150 |
| 2006/0121667 A1 * | 6/2006 | Bae et al. | ..................... | 438/202 |
| 2006/0134893 A1 * | 6/2006 | Savage et al. | ............... | 438/483 |
| 2006/0228851 A1 * | 10/2006 | Sadaka et al. | ................ | 438/221 |
| 2007/0004161 A1 * | 1/2007 | Chantre et al. | .............. | 438/309 |
| 2007/0128789 A1 * | 6/2007 | Lim et al. | .................... | 438/202 |
| 2007/0238258 A1 * | 10/2007 | Adam et al. | ................ | 438/350 |

FOREIGN PATENT DOCUMENTS

EP    0 657 942 A2    6/1995

* cited by examiner

INTEGRATED SIGE NMOS AND PMOS TRANSISTORS

This application claims priority under 35 U.S.C. 119 from German Application No. DE 10 2006 028 543.3 filed Jun. 21, 2006, and from U.S. Provisional Application No. 60/882,367 filed Dec. 28, 2006, the entireties of both of which are incorporated herein by reference.

BACKGROUND

The invention relates to a method of fabricating an integrated BiCMOS circuit including bipolar transistors and CMOS transistors on a substrate. In particular, the invention relates to a method comprising the step of forming an epitaxial layer including a silicon germanium sublayer. The invention further relates to an integrated BiCMOS circuit comprising an epitaxial layer with a silicon-germanium sublayer.

It is known to integrate bipolar devices with MOSFET devices on a substrate. Forming so-called BiCMOS circuits demands a complicated fabrication process with many steps, as fabrication steps performing base, emitter and collector of a bipolar transistor differ from fabrication steps for forming source, drain and gate of a MOSFET device.

It is further known to use silicon-germanium (SiGe) to improve the properties of bipolar transistors. Bipolar devices benefit especially from the lower band gap in silicon-germanium in comparison to silicon, which increases the electric field across the base junction and thus reduces the transit time.

Therefore, bipolar devices require the SiGe in the base region, which is typically in a depth of 50 to 100 nm of the base epitaxial layer.

MOS devices can also be improved by the use of SiGe. They benefit from the increased electron and hole mobility of SiGe with respect to Si. By integrating silicon-germanium into CMOS transistors, the area ratio between NMOS and PMOS structures becomes close to one. Standard designs like inverters can be much denser. The drive current is also increased. The current in MOS devices flows laterally on the surface of the bulk silicon. Therefore, MOS devices need silicon-germanium on the surface of an epitaxial channel layer.

If a BiCMOS circuit is required which combines high performance bipolar transistors including a silicon-germanium base with high performance CMOS transistors comprising a silicon-germanium channel, four different epitaxial layers are to be formed as the bipolar and the MOS devices require the SiGe layer in different depths. The resulting structure will have: an epitaxial layer for the P-doped base of an NPN bipolar transistor; an epitaxial layer for the N-base of a PNP transistor; an epitaxial layer for the P-channel of an NMOS transistor; and an epitaxial layer for the N-channel of a PMOS transistor. Every epitaxial layer demands several process steps such as, for example, masking, depositing, cleaning, etc.

There is a need to simplify the method of producing an integrated BiCMOS circuit while using the advantages of silicon-germanium for the bipolar transistors as well as for the CMOS transistors. There is also a need to reduce the number of necessary process steps.

SUMMARY

In a first aspect of the invention, a method for the fabrication of an integrated BiCMOS circuit is provided.

In an implementation, the inventive method comprises a step of forming an epitaxial layer to form a channel region of a MOS transistor and a base region of a bipolar transistor. The step of forming the epitaxial layer includes epitaxially growing a first sublayer of silicon; epitaxially growing a first sublayer of silicon-germanium onto the first sublayer of silicon; epitaxially growing a second sublayer of silicon onto the first sublayer of silicon-germanium; and epitaxially growing a second sublayer of silicon-germanium onto the second sublayer of silicon. Germanium is added twice to the epitaxial layer, thus forming an epitaxial layer with silicon-germanium in two different depths.

In a preferred embodiment, the first sublayer of silicon-germanium is increasingly doped in situ with a dopant, and the second sublayer of silicon is decreasingly doped in situ with the dopant. When a P-dopant such as boron is used, a base region for a bipolar NPN transistor and at the same time a channel region for an NMOS transistor can be formed. If an N-dopant such as arsenic is used, a base region of a bipolar PNP transistor and a channel region of a PMOS transistor can be formed simultaneously.

Preferably the concentration of germanium in the first sublayer of silicon-germanium is lower than the concentration of germanium in the second sublayer of silicon-germanium. The profile of the dopant included in the epitaxial layer provides preferably a retrograde channel profile for the MOS transistors.

In a preferred embodiment, the inventive method includes a step of forming a doped emitter for the bipolar transistor diffusing at least into the second sublayer of silicon-germanium. Advantageously, the steps of growing the first and the second silicon-germanium sublayers provide layers with a strained lattice.

In another aspect, the invention provides a BiCMOS integrated circuit including bipolar transistors and CMOS transistors on a substrate, the circuit comprising an epitaxial layer which includes a dopant and which forms a channel region of a MOS transistor and a base region of a bipolar transistor. In an implementation, the epitaxial layer (28) has a first sublayer of silicon; a first sublayer of silicon-germanium on top of the first sublayer of silicon and doped with the dopant to give a dopant profile that increases starting from the first sublayer of silicon; a second sublayer of silicon on top of the first sublayer of silicon-germanium and doped with the dopant to give a dopant profile that decreases starting form the first sublayer of silicon-germanium; and a second sublayer of silicon-germanium on top of the second sublayer of silicon.

BRIEF DESCRIPTION OF THE DRAWINGS

Further advantages and features of the invention will become apparent from the following detailed description, with reference to the appended drawings wherein.

DETAILED DESCRIPTION OF EXAMPLE EMBODIMENTS

FIGS. 1 to 5 are schematic views showing structures relevant to the described example embodiments the invention. Those skilled in the art will appreciate that other steps and features of various kinds will also be present. The drawings and, in particular, the relative thicknesses of the illustrated sublayers, are not to scale.

Figure 1:
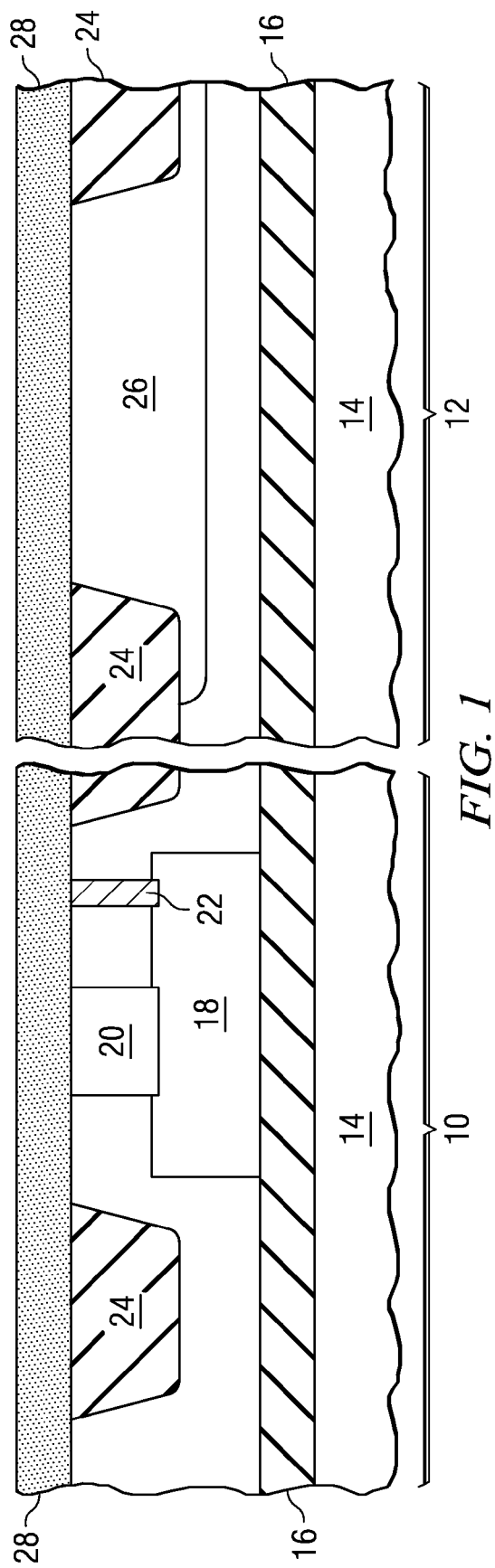
FIG. 1 shows a sectional view through parts of a wafer comprising bipolar and MOS transistors during the fabrication process.

In FIG. 1, the sectional view through a wafer shows on the left hand side the first structures formed for a bipolar transistor 10 and on the right hand side the first structures formed for a field effect transistor 12. The two transistors 10 and 12 may be neighboring on a BiCMOS circuit or they may be separated by other structures. This fact is indicated by the dashed lines in the middle of FIG. 1. On a substrate 14, which may be a silicon wafer, a buried oxide layer 16 is formed of silicon dioxide for example and used for electrically insulating the overlying layers. For the bipolar transistor 10 a buried layer 18 is formed, which is doped with a high concentration of P-type dopant for a PNP transistor or with a high concentration of N-type dopant, if an NPN transistor is to be formed. A collector region 20 is implanted which is P-doped for a PNP transistor and N-doped for an NPN transistor. The collector is contacted via a contact terminal 22 and the buried layer 18. The device is isolated from the surrounding wafer by trenches 24.

For MOS transistor 12, a buried oxide layer 16 is equally formed. For a PMOS transistor a well structure 26 is formed using N-dopants. For an NMOS transistor the well structure 26 is formed using P-dopants. MOS transistor 12 is also isolated from the surrounding wafer by trenches 24. After the before-mentioned structures for the bipolar transistors and the MOS-transistors have been formed, which is usually effectuated in separate process steps for the bipolar transistors and for the MOS transistors, but may be done in combined process steps for some structures, an epitaxial layer 28 is grown forming a base layer for bipolar transistor 10 and forming a channel region for MOS transistor 12.

Figure 2:
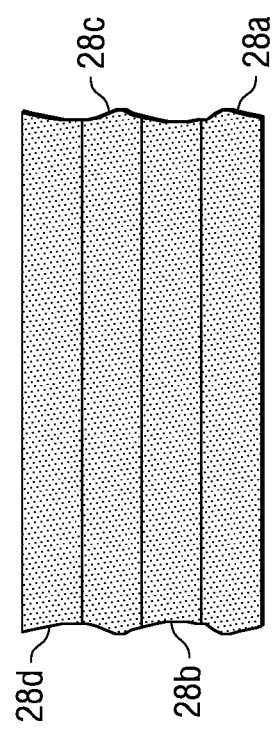
FIG. 2 shows a detailed view of the epitaxial layer forming the base of a bipolar transistor and the channel of a MOS transistor.

The step of growing epitaxial layer 28 comprises growing of four sublayers 28a to d as shown in FIG. 2. Growing the epitaxial layer 28 is started by growing a first sublayer of silicon 28a. Then a first sublayer of silicon-germanium 28b is grown epitaxially onto the first sublayer of silicon 28a. In the preferred embodiment, the first sublayer of silicon-germanium 28b is doped increasingly with a dopant. This dopant is a P-dopant if a channel region for an NMOS transistor and a base region for a bipolar NPN transistor is to be formed. The P-dopant is preferably boron. The dopant is an N-dopant for forming a channel region of a PMOS transistor and a base region of a bipolar PNP transistor. The N-dopant is preferably arsenic. On top of the first sublayer of silicon-germanium 28b, a second sublayer of silicon 28c is grown. Preferably, the second sublayer of silicon is decreasingly doped with the same dopant as the first sublayer of silicon-germanium. Next a second sublayer of silicon-germanium 28d is grown epitaxially onto the second sublayer of silicon 28c. In the preferred embodiment, the concentration of germanium in the second sublayer of silicon-germanium is higher than the concentration of germanium in the first sublayer of silicon-germanium.

Figure 3:
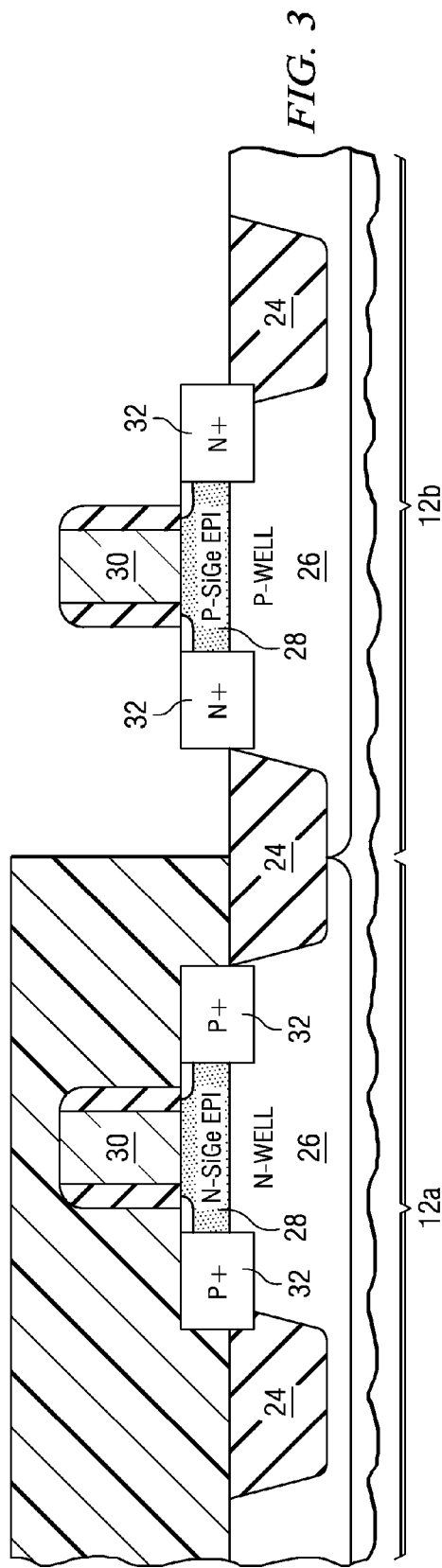
FIGS. 3 and 4 show further process steps for the formation of PMOS and NMOS transistors.

FIG. 3 shows a sectional view of a BiCMOS circuit with two CMOS transistors 12a and 12b after several further process steps. Substrate 14 and buried oxide layer 16 are not shown. Transistor 12a is a PMOS transistor with an N-well structure 26 and transistor 12b is an NMOS transistor with a P-well structure 26.

The transistors are separated from each other and from the surrounding wafer by trenches 24. The channel region of PMOS transistor 12a is formed by an epitaxial layer comprising the previously described four sublayers 28a to 28d, the dopant used is an N-dopant, preferably arsenic. This epitaxial layer has been formed in a common step with the epitaxial layers for PNP transistors included on the BiCMOS circuit. This is not shown in FIG. 3. After masking the PMOS channel regions and the PNP base regions, the epitaxial layer has been removed by an appropriate technique from the other wafer regions. In a next process step an epitaxial layer 28 is grown comprising the steps of growing four sublayers. This time a P-dopant, preferably boron is used. In a masking step the channel regions of NMOS transistors and the base regions of NPN transistors are covered with a resist and the P-doped epitaxial layer is removed from the other areas of the wafer. In further process steps gate structures 30 are formed. Then drain and source structures 32 are formed, preferably by implantation. As well known in the state of the art, areas of the wafer which are not subject to the implantation step are protected by a resist cover. This is the process step actually shown in FIG. 3.

Figure 4:
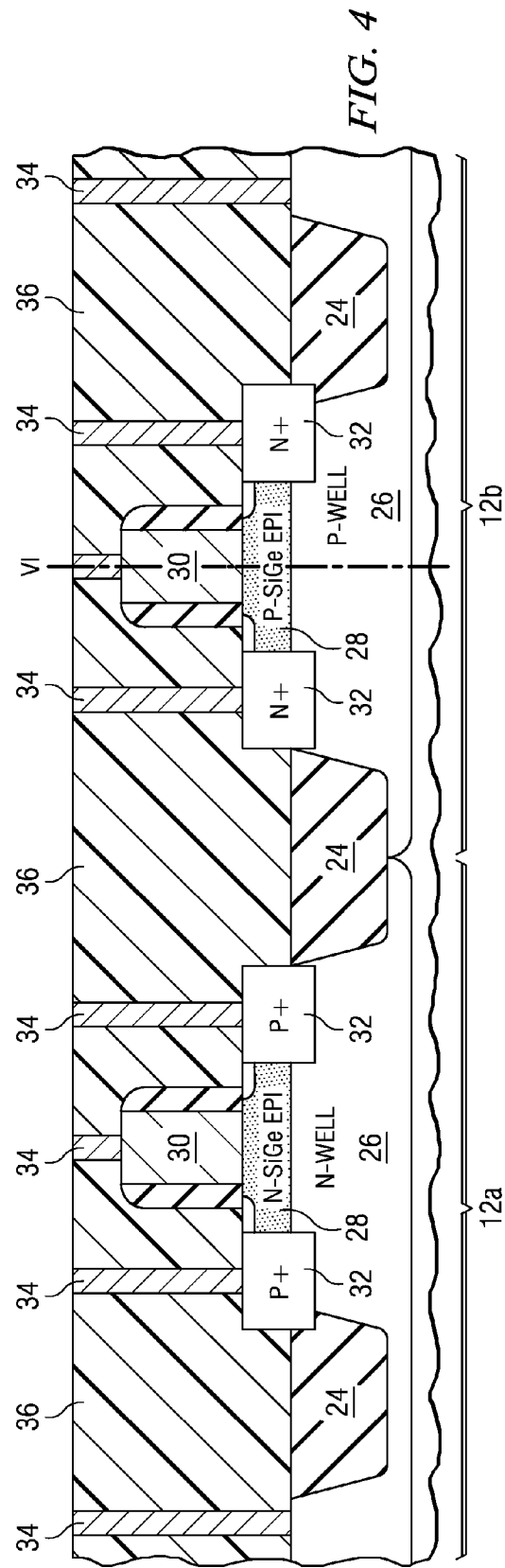

FIG. 4 shows the same part of the BiCMOS circuit as FIG. 3 after some more process steps have been performed. Drain, source and gate of the transistors are now provided with contact terminals 34 and the surface of the circuit is protected by a protective layer 36.

Figure 5:
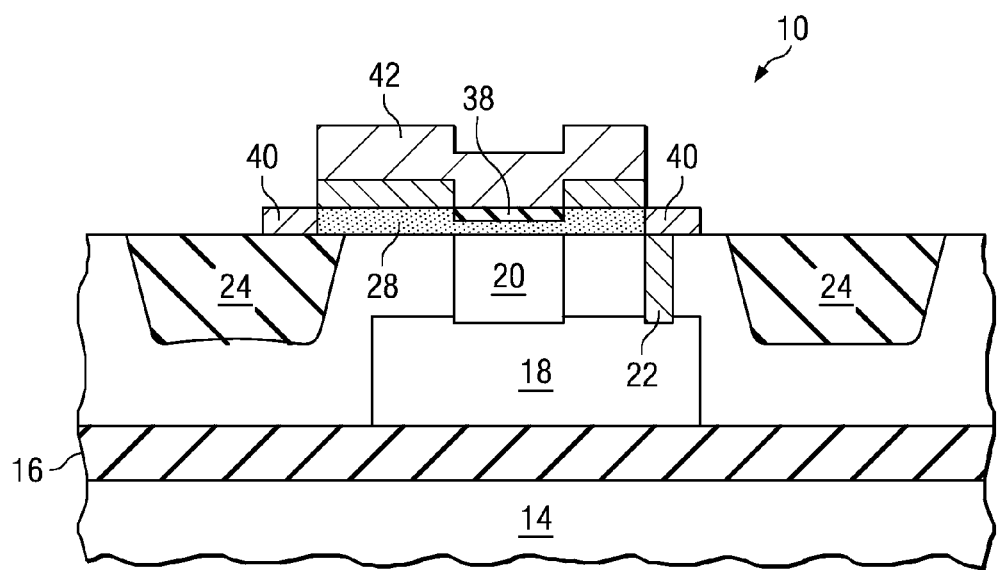
FIG. 5 shows a bipolar transistor with the emitter formed.

FIG. 5 shows the bipolar transistor 10 after further process steps. Substrate 14, buried oxide layer 16, buried layer 18, collector 20 and contact terminal 22 as well as trenches 24 are the same as shown in FIG. 1. The base region is formed by an epitaxial layer 28 comprising the four inventive sublayers 28a to d, A doped emitter 38 is formed diffusing at least into the second sublayer of silicon-germanium 28d. Transistor 10 is further provided with a base contact 40 and an emitter contact 42.

Figure 6:
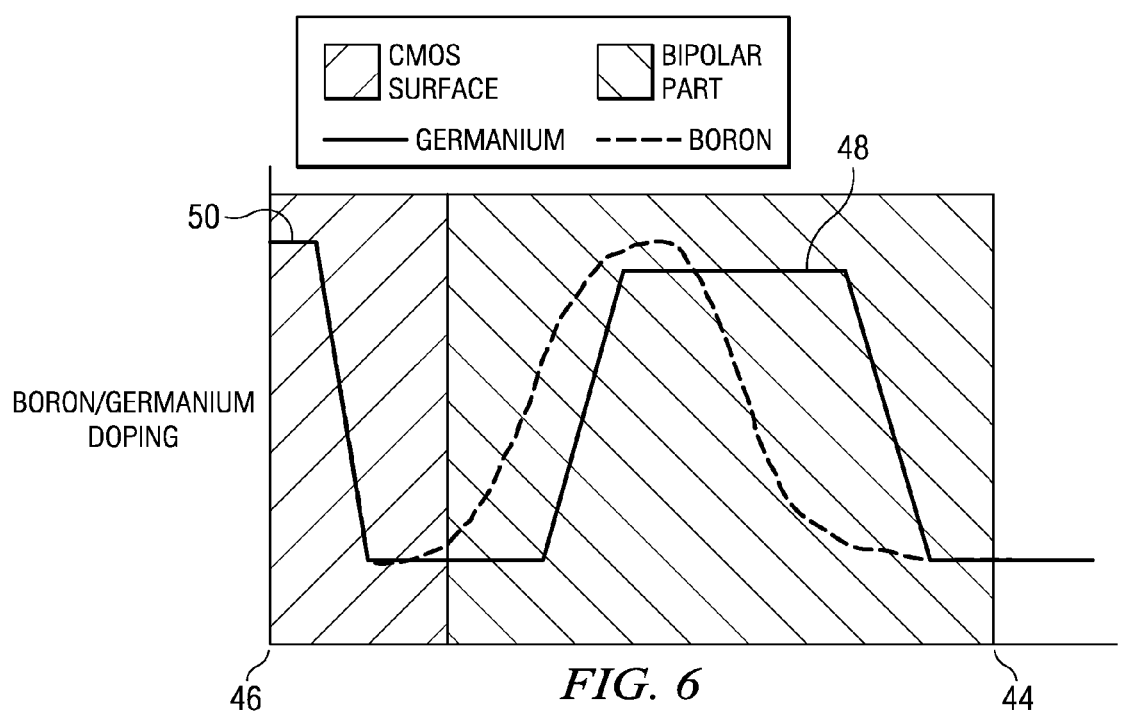
FIG. 6 shows a diagram illustrating the doping profile of the epitaxial layer for an NPN and an NMOS transistor.

FIG. 6 shows the channel doping profile along the line VI in FIG. 4. It shows the doping profile for an NMOS transistor. For a PMOS transistor, the boron is to be replaced by arsenic. The X-axis indicates the depth of the epitaxial layer. At reference sign 44 the first sublayer of silicon 28a starts, whereas at reference sign 46 the second sublayer of silicon-germanium 28d forms the surface of the epitaxial layer 28. Starting from the first sublayer of silicon 28a or at reference sign 44, there is no germanium and no boron added to the silicon. Then follows the first sublayer of silicon-germanium with a flat germanium profile 48 and an increasing boron profile. The second sublayer of silicon 28c follows with no germanium added and a decreasing boron concentration. The last sublayer, the second sublayer of silicon-germanium 28d is not doped with boron. The germanium profile 50 is flat and the germanium concentration is higher than the germanium concentration in the first sublayer of silicon-germanium 28b. The germanium profile shows a ramp at the interfaces between the silicon-sublayers and the silicon-germanium sublayers. The germanium concentration 48 enhances the performance of the bipolar transistors. It is in the deeper layers of the epitaxial layer 28. The lower band gap in silicon-germanium in comparison to silicon increases the electrical field across the base junction. Therefore, the transit time is reduced and the speed of the bipolar transistors is increased.

The germanium concentration 50 is important for the increased electron and hole mobility from which MOS-devices profit, as the currents in MOS devices flow laterally on the surface of the bulk silicon. The germanium concentration 50 is chosen to be higher than the germanium concentration 48 to achieve a highly strained lattice which further increases the electric carrier mobility. The germanium added at the surface of epitaxial layer 28 in the second sublayer of silicon-germanium 28d does not impact the performance of the bipolar transistors, since the highly doped emitter will diffuse through this layer. The concentration of the dopant boron, respectively the dopant arsenic, is high so as to act as a retrograde channel profile. This further increases the channel carrier mobility.

Those skilled in the art to which the invention relates will appreciate that the described example embodiments are merely representative of the many implementations and variations of implementations that are possible for the claimed invention.

What is claimed is:

1. An integrated circuit comprising:
   at least one MOS transistor; and
   at least one bipolar transistor,
   wherein a channel of said MOS transistor and a base of said bipolar transistor are simultaneously formed in a common epitaxial layer disposed on a semiconducting surface of a substrate, said epitaxial layer comprising first and second silicon layers and first and second silicon-germanium layers, wherein said first silicon layer is interposed between said semiconducting surface and said second silicon-germanium layer, wherein said first silicon-germanium layer is interposed between said first and said second silicon layers, and wherein said second silicon layer is interposed between said first and said second silicon-germanium layers; and
   wherein said first layer of silicon-germanium includes an increasing concentration of dopant; said second layer of silicon includes a decreasing concentration of the same dopant; and the concentration of germanium in the second layer of silicon-germanium is higher than the concentration of germanium in the first layer of silicon-germanium.

2. The integrated circuit of claim 1, wherein said first and said second germanium layers are compressively strained.

3. A method of fabricating an integrated BiCMOS circuit, the circuit including bipolar transistors and CMOS transistors on a substrate, the method comprising:
   forming a buried oxide layer at bipolar and MOS transistor regions in a semiconductor substrate;
   in the bipolar transistor region of the substrate, forming a doped buried layer over the buried oxide layer, forming a doped collector region over the doped buried layer, and forming a contact terminal to contact the doped collector region via the doped buried layer;
   in the MOS transistor region of the substrate, forming a doped well structure;
   forming isolation regions to isolate active areas of the bipolar and MOS transistor regions;
   following the above steps, growing a common epitaxial layer over the substrate to form a base layer over the bipolar transistor region and a channel region over the MOS transistor region; the growing of the epitaxial layer including:
   epitaxially growing a first sublayer of silicon on exposed silicon of the substrate;
   epitaxially growing a first sublayer of silicon-germanium on the first sublayer of silicon; the first sublayer of silicon-germanium being increasingly doped with a dopant;
   epitaxially growing a second sublayer of silicon on the first sublayer of silicon-germanium; the second sublayer of silicon being decreasingly doped with the same dopant as the first sublayer of silicon-germanium; and
   epitaxially growing a second sublayer of silicon-germanium on the second sublayer of silicon; the concentration of germanium in the second sublayer of silicon-germanium being higher than the concentration of germanium in the first sublayer of silicon-germanium.

4. The method of claim 3, comprising the step of forming two epitaxial layers, wherein the dopant of a first epitaxial layer is a P-dopant to form a channel region of an NMOS transistor and a base region of a bipolar NPN transistor; and the dopant of a second epitaxial layer is an N-dopant to form a channel region of a PMOS transistor and a base region of a bipolar PNP transistor.

5. The method of claim 3, wherein the dopant included in the epitaxial layer provides a retrograde channel profile for the MOS transistor.

6. The method of claim 3, including the step of forming a doped emitter for the bipolar transistor diffusing at least into the second sublayer of silicon-germanium.

7. The method of claim 3, wherein the steps of growing the first and the second silicon-germanium sublayers provide said first and said second silicon-germanium sublayers with a compressively strained lattice.

8. The method of claim 4, wherein the P-dopant is boron and the N-dopant is arsenic.

* * * * *